United States Patent [19]

Neidig et al.

[11] Patent Number: 4,788,626
[45] Date of Patent: Nov. 29, 1988

[54] POWER SEMICONDUCTOR MODULE

[75] Inventors: Arno Neidig, Plankstadt; Reinhold Bayerer, Reichelsheim; Bertold Hahn, Hofheim, all of Fed. Rep. of Germany

[73] Assignee: Brown, Boveri & Cie AG, Mannheim, Fed. Rep. of Germany

[21] Appl. No.: 14,272

[22] Filed: Feb. 12, 1987

[30] Foreign Application Priority Data

Feb. 15, 1986 [DE] Fed. Rep. of Germany ....... 3604882

[51] Int. Cl.$^4$ .............................................. H05K 7/20
[52] U.S. Cl. ................... 361/386; 174/52 PE; 174/525; 357/72; 357/81; 361/395; 361/399
[58] Field of Search ............. 174/52 PE, 52 H, 52 R, 174/52 FP; 357/74, 80, 81, 72; 361/386–389, 394–395, 399

[56] References Cited

U.S. PATENT DOCUMENTS 4,639,759  1/1987  Neidig et al. ..................... 357/74

FOREIGN PATENT DOCUMENTS 3521572  12/1986  Fed. Rep. of Germany ........ 357/74
0130448   7/1984  Japan ............................... 357/81

OTHER PUBLICATIONS

Cain et al, "Circuit Module with Removable Cap" IBM Technical Disclosure Bulletin, vol. 19, No. 5, 10/76, p. 1803.

Primary Examiner—A. D. Pellinen
Assistant Examiner—Gregory D. Thompson
Attorney, Agent, or Firm—Herbert L. Lerner; Laurence A. Greenberg

[57] ABSTRACT

A power semiconductor module includes a plastic housing having an interior. A substrate in the form of a ceramic plate with upper and lower surfaces is inserted in the housing as a housing bottom. Metallizations are disposed on the upper and lower surfaces of the ceramic plate. The metallization on the upper surface of the ceramic plate faces the interior of the housing and is structured to form conductor paths. Power semiconductor components, connecting elements and terminal elements for external termimals all are disposed on the upper surface of the ceramic plate. A frame is connected to the substrate in the interior of the housing for sealing against moisture.

10 Claims, 5 Drawing Sheets

POWER SEMICONDUCTOR MODULE

The invention relates to a power semiconductor module having a plastic housing into which a substrate is inserted as a housing bottom. A ceramic plate has metallizations on the upper and lower surfaces thereof. The metallization on the upper surface of the ceramic plate facing the interior of the housing is structured to form conductor paths and the upper surface has power semiconductor components, connecting elements and terminal elements for external terminals.

A module of this kind is known from German Patent No. DE-PS 31 27 457, corresponding to allowed U.S. application Ser. No. 762,802, filed Aug. 2, 1985. The typical power range of such power semiconductor modules is characterized by currents above 10 A and blocking voltages of approximately 400–2000 V, corresponding to network connection voltages of up to 600 $V_{eff}$. Modules in this power range can be produced by soldering or pressure contact techniques. The present invention relates to modules made by soldering techniques and in particular relates to the problem of moistureproof encapsulation. The invention also relates to methods for producing modules with moistureproof encapsulations.

In known module constructions, dampness of up to 70% relative humidity is usually not harmful. For some applications, however, there are more stringent requirements in terms of being moistureproof. In such cases, typical test conditions are 100 hours of storage of the components in an autoclave at 0.2 MPa of water vapor pressure and a temperature of 120 degrees C., or 1000 hours of storage at 85 degrees C. and 85% relative humidity. During the storage, the components may also be subjected to an electrical voltage. Corrosive agents may also be mixed in with the atmosphere (for example, a salt spray test and $SO_2$ admixtures).

Moisture can impair the blocking ability of semiconductor chips incorporated in the module. The insulation strength can also be lost. With cut off thyristors, the fine metallization paths or runs on the chips can corrode, which can cause interruptions in current or short circuiting between control and power electrodes.

No truly moistureproof module construction with a plastic housing was known heretofore, although there was no lack of attempts to produce moistureproof modules. In typical modules having a plastic housing and a ceramic substrate used as the bottom, leaks arise from the fact that the relatively thin plastic housing walls and the seams between the housing and bottom plate allow water vapor to penetrate, such as because the adhesive is not perfect. The adhesive site may also tear open after frequent temperature changes. Such modules of this type are not durably moistureproof even though the housing and substrate are both thin which permits the elements to adaPt to one another by flexing in response to temperature changes.

An obvious way to avoid problems resulting from plastic housings is to use ceramic instead of plastic. A ceramic housing of this kind has been proposed, for instance, in European Patent No. 0 037 301. In that device, a hood-like housing is provided, which is secured to a ceramic substrate and has holes at the top through which metal pins for external terminals are extended. For various reasons, however, this concept is not suitable for modules of higher power. With current intensities beyond approximately 100 A, copper pins having a cross section of at least 10 mm² must be used. Cracks in the ceramic may result because of the difference in expansion of copper and ceramic. Problems also arise from the proposed mounting of the module on a heat sink by means of screws through bores in the ceramic substrate. Even if elastic shims are used, the danger of breakage of the ceramic is very high if, for example, M5 screws are used that are tightened by torques between 2 and 3 Nm. Sturdier or in other words thicker ceramic substrates cannot be used because of the thermal resistance. A screw connection with the aid of screws in the housing, which is thicker than the substrate, is unsuitable because of the extraordinary brittleness of the ceramic material. In order to attain the required electric flashover resistance, the module would have to be filled with sealing compound. There is no indication in this patent of such a provision and in particular there is no mention of a filling opening or any instructions as to how such an opening would be sealed.

German Published, Non-Prosecuted Application No. DE-OS 33 18 289 discloses another proposal for a moistureproof module and here again a ceramic housing is provided. The module housing is in the form of a plurality of parts that are coated with glass. In order to close the housing, these glass coatings must be melted. Since this melting process takes place after the soldering process and requires a higher temperature than the soldering process and since silicone resin filled into the element does not withstand a high temperature, only the connecting points can be allowed to be exposed to the required high temperature. A method using a microburner or a laser beam has therefore been proposed, but this entails high cost. In view of the thermal resistance, the intended thick metal bottom plate having a W or Mo compensating washer is also disadvantageous.

Other moistureproof configurations are also known from information processing electronics, but their concept cannot be applied to modules for power electronics because, for example, metal housings are used, which cause short leakage paths and air gaps.

It is accordingly an object of the invention to provide a power semiconductor module which overcomes the hereinafore-mentioned disadvantages of the heretofore-known methods and devices of this general type and in particular to disclose a moistureproof power semiconductor module having a plastic housing which meets the above-mentioned test specifications as well as manufacturing methods for such a module.

With the foregoing and other objects in view there is provided, in accordance with the invention, a power semiconductor module, comprising a plastic housing having an interior. A substrate in the form of a ceramic plate with upper and lower surfaces is inserted in the housing as a housing bottom. Metallizations are disposed on the upper and lower surfaces of the ceramic plate. The metallization on the upper surface of the ceramic plate faces the interior of the housing and is structured to form conductor paths. Power semiconductor components, connecting elements and terminal elements for external terminals all are disposed on the upper surface of the ceramic plate. A frame is connected to the substrate in the interior of the housing for sealing against moisture.

In accordance with another feature of the invention, the metallizations on the ceramic plate are at least 0.1 mm thick and preferably 0.3 mm thick.

In accordance with a further feature of the invention, the frame is formed of ceramic material having substantially the same thermal expansion properties as the substrate.

In accordance with an added feature of the invention, the frame is formed of metal.

In accordance with an additional feature of the invention, the frame is formed of ductile sheet copper.

In accordance with yet another feature of the invention, the frame is formed of sheet nickel-iron.

In accordance with yet a further feature of the invention, the frame has a ribbing formed thereon.

In accordance with yet an added feature of the invention, the metallization on the upper surface of the ceramic plate has a metal rim formed thereon in addition to the conductor paths.

In accordance with yet an additional feature of the invention, the frame has an intermediate bottom forming a soldering mold.

The proposed structure is not restricted to a particular power range and also has the advantage of allowing the module to be be set in transformer oil. On the other hand, in conventional module constructions there is the danger of oil seeping into the interior through the adhesive site, causing the silicone sealing compound to swell and then burst the housing.

The frame for moistureproofing according to the invention may be produced from a dense ceramic or from metal. In the case of the ceramic frame, the ceramic should have the same thermal expansion properties as the substrate, which is thickly coated with copper on both sides. A metal frame should either have the same expansion properties as the substrate or should be so yielding, such as a ductile copper plate 0.3 mm thick, that excessively great mechanical strain is not exerted upon the substrate.

In any case, a tight connection must be provided between the frame and the substrate. This may be attained for example by soft soldering, by adhesive, or by using a direct bonding method.

In order to produce a tight connection by soft soldering, the base of a ceramic frame and the edge of the substrate are metallized in a suitable manner. This metallization may be provided according to thickfilm technology for example and a reinforcement by means of chemically deposited films of nickel and gold can be provided to improve the solderability.

The production of the connection between the frame and the substrate by a direct bonding method is particularly suitable when a copper frame used. However, ceramic frames can also be connected to the substrate in this manner and in that case the ceramic frame is suitably constructed in such a way that it can serve as a lost soldering mold or form during the ensuing soldering of components. Since a subsequent wire bonding by means of ultrasound to make wire connections between semiconductor chips and conductor paths is difficult with this manner of production, the method is particularly suitable for thyristors and diode modules, in which wire bonding is not required.

If wire bonding is required, a production method is suitably selected in which a frame, after assembly and including soldering and wire bonding, is connected to the substrate in a second soldering step, using soft solder that melts at a lower temperature.

If the frame/substrate connection is produced by adhesive, care should be taken to ensure that the adhesive connection is sufficiently wide to prevent water vapor from diffusing into the module during moisture tests. The required width of the edge provided for adhesive is dependent on the particular strain to which the element will be subjected. A pressure setting plastic such as epoxy resin should be provided as the adhesive agent, because epoxy resins, in contrast to silicone elastomers, have a lower permeability to water vapor. At the typical hardening temperatures of epoxy resin of 130 degrees C., bending strains do not yet arise in the substrate, that is, in the metallized ceramic. As a result, a narrow adhesive gap between the frame and substrate can be attained, which has only a small surface area that could be attacked by water vapor. Epoxy resins furthermore adhere particularly well to ceramic and metal. The upper portion of a ceramic frame should be reinforced to enable it to withstand the forces involved in hardening and shrinking of the resin sealing compound. If such reinforcement is not possible, such as if the frame is constructed for use as a lost soldering form or mold, then a body of inexpensive but dense ceramic material can be used prior to the resin sealing. The required thickness of the resin sealing layer depends on the stress due to moisture. By ribbing the frame or using an insert, cracks in the ceramic or in the epoxy resin after hardening are effectively prevented. The ribbing or inserts should be constructed in such way that they do not hinder electrical connections.

The application of sealing compound techniques assures that even thick copper connections can be extended out of the housing in a moistureproof manner with relatively wide tolerances in terms of their dimensions and their position on the substrate. Due to the good thermal adaptation of the substrate and the frame to one another, there is also no danger that the soldering or adhesive will penetrate between the frame and substrate and make it leak.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of specific embodiments when read in connection with the accompanying drawings.

Figure 1:
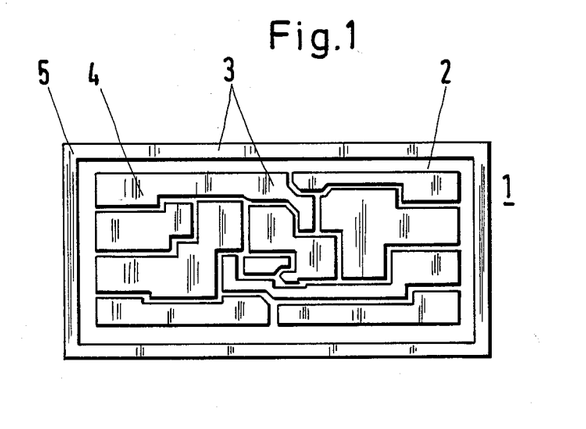
FIG. 1 is a diagrammatic top-plan view of the upper surface of a ceramic plate having a structured metallization.

Referring now to the figures of the drawings in detail and first, particularly, to FIG. 1 thereof, there is seen a first substrate 1, which is formed of a ceramic plate 2 of aluminum oxide (at least 96% pure), and which has a metallization 3 that is at least 0.1 mm thick and preferably is 0.3 mm thick on the top and bottom thereof. The metallization 3 is produced by direct bonding of copper foils to the ceramic plate 2, using what is known as a direct bonding method. The metallization 3 on the top of the ceramic plate 2, which will later face the interior of the module, is structured. The structuring may be produced for example by etching the copper foil that has already been joined to the ceramic 2, or by suitably stamping the copper foil prior to bonding to the ceramic plate 2. The structuring is used to form conventional conductor paths or runs or printed conductors 4 of the metallization 3 on the substrate 1 as well as a metal rim 5 of the metallization 3 extending all the way around, which is approximately 2 to 3 mm wide. The spacing between the metal rim 5 and conductor paths or runs 4 is selected in such a way that an insulation strength with an effective value of 2.5 kV (1 min) is attained in the sealed state. The width of approximately 2 to 3 mm of the metal rim or edge 5 mentioned above is required in order to attain a tight, bubble-free soldered connection.

Figure 2:
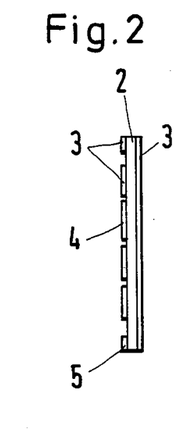
FIG. 2 is a side-elevational view of the ceramic plate shown in FIG. 1, which is metallized on both sides.

FIG. 2 is a side view of the substrate 1 shown in the plan view of FIG. 1.

Figure 3:
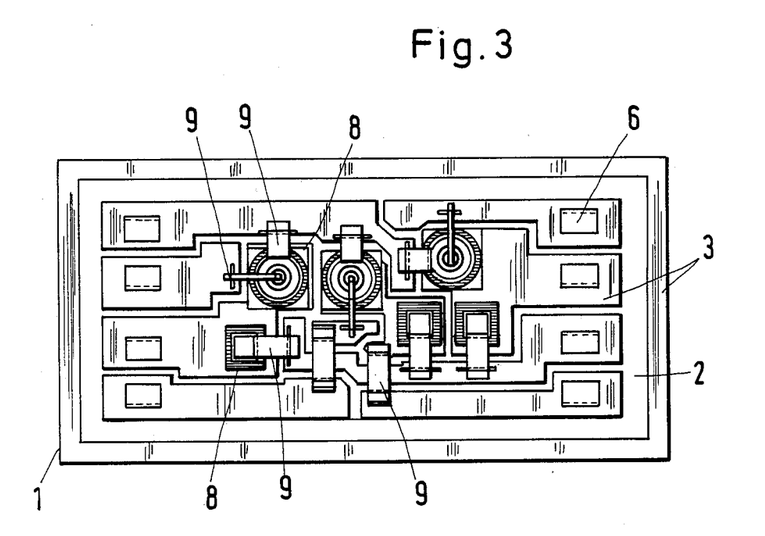
FIG. 3 is a top-plan view of an assembled and soldered substrate (metallized ceramic plate)

FIG. 3 shows the substrate 1 after a further production step. In this step, the substrate 1 was assembled with connecting elements 6 for external terminals 7 seen in FIG. 8, semiconductor components 8 and connecting elements 9 and the substrate was soldered with a solder having a melting temperature T1 of a approximately 300 degrees C. (such as Pb5Sn).

Figure 4:
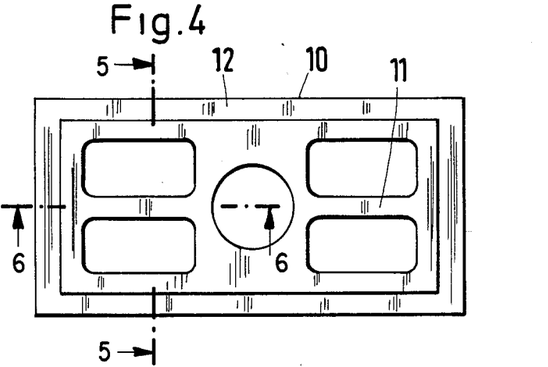
FIG. 4 is a top-plan view of a ceramic frame.
Figure 8:
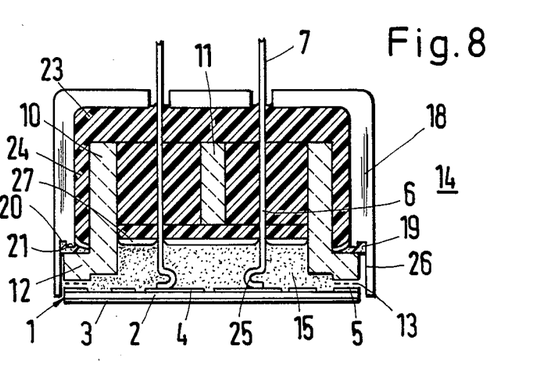
FIG. 8 is a cross-sectional view of a power semiconductor module having a ceramic frame for moistureproofing.

FIG. 4 shows a first ceramic frame 10 in plan view. The frame 10 which is made of ceramic such as Steatite or Stealane and is sold by the firm Sembach located at 8560 Lauf, Federal Republic of Germany, has a ribbing 11 and a step 12 on the base thereof. The ceramic frame 10 is intended for insertion into a power semiconductor module 14, as seen in FIG. 8.

Figure 5:
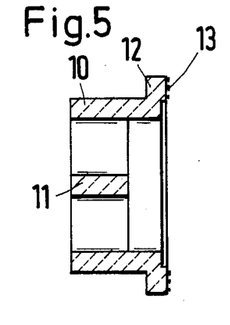
FIG. 5 is a cross-sectional view of the ceramic frame taken along a line 5—5 in FIG. 4, in the direction of the arrows.

FIG. 5 shows the ceramic frame 10 in a section taken along the line 5—5 in FIG. 4. The lower surface of the step 12 of the frame 10 is provided with a metal coating, layer or film 13 extending all around it, which has been suitably premoistened with solder.

Figures 6, 7:
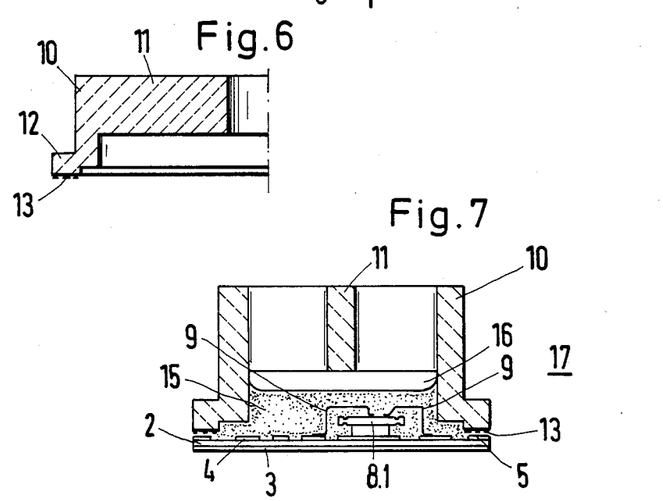
FIG. 6 is a cross-sectional view of half of the ceramic frame taken along a line 6—6 in FIG. 4, in the direction of the arrows.
FIG. 7 is a cross-sectional view of a ceramic frame soldered to the substrate.

FIG. 6 shows the frame 10 in a section taken along the line 6—6 in FIG. 4.

FIG. 7 shows a sectional view of an intermediate product 17, which is formed of the frame 10 and the substrate 1 soldered and assembled to the frame. In order to perform the soldering, PbSn may for instance be used. The soldering temperature T2 must be below the melting temperature T1 of the solder used in the previous soldering operation, such as between 180 degrees C. and 230 degrees C. As FIG. 7 shows, the metallized step 12 of the ceramic frame 10, to which solder has been previously been applied, is soldered to the metal rim 5 on the ceramic plate 2. The previous application of solder to the metal coating, layer or film 13 on the lower surface of the step 12 avoids a tedious insertion or embedding of a soldering foil prior to the soldering operation. After the soldering operation, the surface of the substrate is covered by pouring a soft elastomeric sealing compound 15 into the frame 10. In doing so, the space above the substrate 1 is filled with the sealing compound 15 up to a height of approximately 3 mm below the ribbing 11. It may be suitable for the elastomeric sealing compound 15 to be filled with mineral fillers such as quartz or dolomite powder, in order to reduce the high thermal volumetric expansion of the elastomer. The ribbing 11 is constructed in such a way that a space 16 for the compound 15 and semiconductor components 8.1 and connecting elements 9 remains between the ribbing 11 and the substrate 1.

FIG. 8 is a section of a completed power semiconductor module 14. The module is produced by installing the intermediate product 17 shown in FIG. 7 in a plastic housing 18. The plastic housing 18 has an opening at the bottom into which the intermediate product 17 is inserted and bonded with the aid of an elastomeric silicone sealing compound 19. A support surface 21 is provided with a groove 20 for receiving the sealing compound 19. The depth of a recess 26 for forming the support surface 21 is selected in such way that the substrate 1 protrudes slightly beyond the edge of the bottom of the plastic housing 18. As a result, when the power semiconductor module 14 is later mounted onto a non-illustrated heat sink, an adequate pressing force is attained. Epoxy resin, such as a sealing compound 23, is poured through a filling opening 22 seen in FIG. 9 on top of the plastic housing 18, and the interior of the power semiconductor module 14 is thereby completely filled. As a result, not only is a good mechanical bond between the intermediate product 17 and the plastic housing 18 attained, but the desired sealing against moisture is also attained. The resin sealing compound 23 fills an interspace 24 which is approximately 1 to 2 mm wide between the frame 10 and the sidewalls of the plastic housing 18 and also fills the remaining interior of the module 14. It is normal and suitable to fill the resin sealing compound 23 with mineral powder.

In the view shown in FIG. 8, the substrate 1 is sectioned along a different plane from that shown in FIG. 7. Thus instead of the semiconductor components 8.1 and connecting elements 9 being shown, FIG. 8 shows the connecting elements 6 which have an expansion arc 25 at the base end thereof. The expansion arc 25 relieves or relaxes the soft soldered connection on the substrate 1.

Since the resin sealing compound 23 is in contact with both the outer wall of the frame 10 as well as the rear wall of the frame 10 beyond the upper rim thereof, detachment of the resin sealing compound 23 is made substantially more difficult, and good adhesion and good sealing are thereby attained. In order to enable the resin sealing compound 23 to grip about the upper rim of the frame 10 in the manner described, the housing 18 should be constructed in such a way that a spacing of approximately 5 mm exists between the housing cap and the upper rim of the frame 10. The intrusion of moisture is avoided at this critical point as well by means of a long contact area between the connecting elements 6 and the resin sealing compound 23. After the hardening of the resin sealing compound 23, a spacing 27 is produced between the resin sealing compound 23 and the soft sealing compound 15, but this spacing has no effect on the sealing action. This spacing 27 is the result of the high volumetric expansion of the elastomer 15 after the hardening of the resin sealing compound 23 at a temperature of 140 degrees C., for example, and a result of the ensuing cooling. The spacing 27 assures that the soft sealing compound 15 is capable of expanding freely during subsequent operation of the component.

Figure 9:
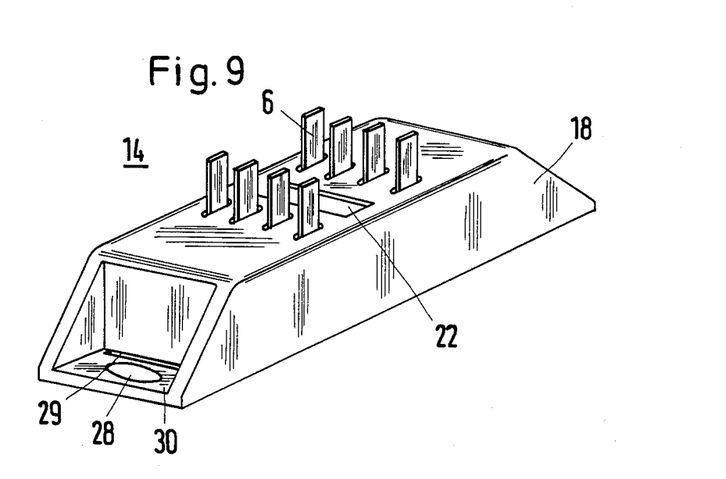
FIG. 9 is a perspective view of the power semiconductor module of FIG. 8.

FIG. 9 shows a perspective view of the module 14. The filling opening 22 for the sealing compound 23 can be seen in the housing cap. The plastic housing 18 has the usual fastening straps or flanges 30 with a fastening hole 28. Respective slits 29 are also provided in the transitional area between the flange 30 and the housing wall, for hindering the transmission of mechanical strains onto the substrate from the screw connection.

Figure 10:
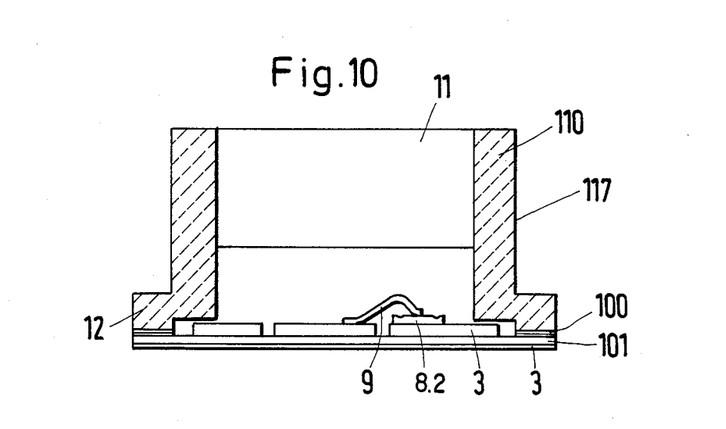
FIG. 10 is a cross-sectional view of another embodiment having a substrate joined to the ceramic frame by adhesion.

As an alternative to the production of the intermediate product formed of the substrate 1 joined to the frame 10 as described with reference to FIGS. 1-7, a second intermediate product 117 may also be produced, as shown in FIG. 10. The point of departure from the device described above is a second substrate 101 having a component 8.2, which differs from the first substrate 1 shown in FIG. 3 by the feature that no metal rim is provided. Additionally, a second ceramic frame 110 is used, which does not have a metal coating on the lower surface of the step 12. The second frame 110 is joined to the second substrate 101 by adhesion or gluing. The adhesive or glue 100 may suitably be a single-component epoxy resin. The module 14 is finished in the same manner as described above after the hardening of the adhesive 100.

A further embodiment, in which a power semiconductor module having a sealing frame of ceramic is once again produced, is shown in FIGS. 11—17.

Figure 11:
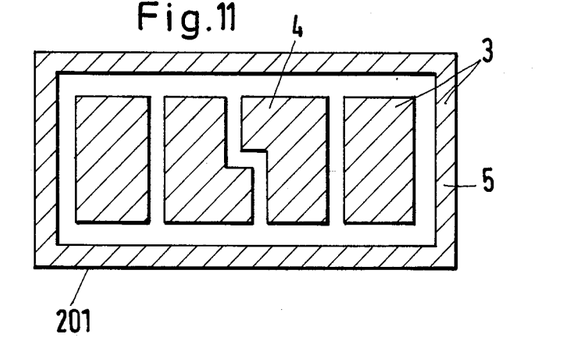
FIG. 11 is a plan view of a substrate for an embodiment having a ceramic frame which includes an intermediate bottom having recesses or voids, as a lost solder mold or form.

FIG. 11 shows a third substrate 201 which, like the first substrate 1 shown in FIG. 1, has a metal rim 5 and conductor paths or runs or printed conductors 4. In this embodiment, the conductor paths or runs 4 are merely constructed differently in terms of surface area.

Figure 12:
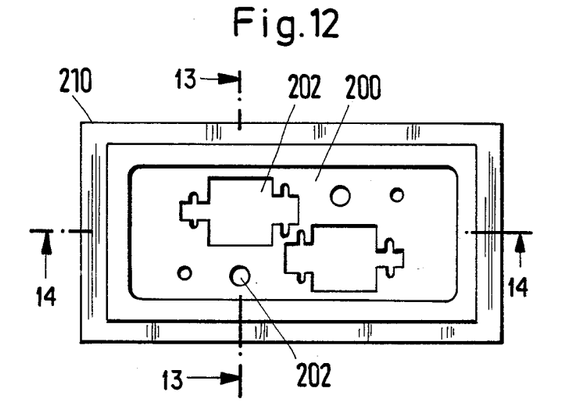
FIG. 12 is a top-plan view of a ceramic frame having an intermediate bottom.

FIG. 12 shows a third ceramic frame 210 in a plan view. The frame 210 does not have any ribbing in its upper portion, but instead has an intermediate bottom 200 with recesses 202 in the lower portion thereof.

Figure 13:
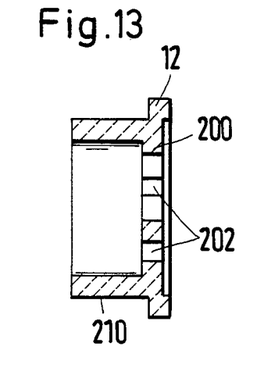
FIGS. 13 and 14 are cross-sectional and fragmentary cross-sectional views taken along the section lines 13 and 14 in FIG. 12, respectively.
Figure 14:
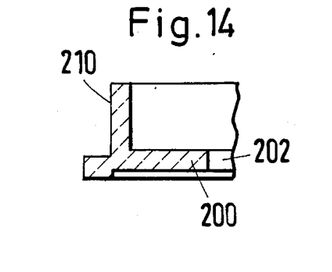

FIG. 13 shows a section through the plane 13 of FIG. 12, and FIG. 14 shows a section taken through the plane 14.

Figure 15:
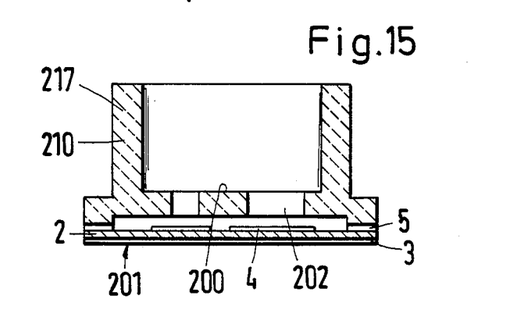
FIG. 15 is a cross-sectional view of the frame according to FIG. 12 after it has been joined to the substrate.

FIG. 15 shows the third ceramic frame 210 in a sectional view after it has been bonded to the third substrate 201 in order to form a third intermediate product 217. The bonding can advantageously be performed by using a direct bonding method, and the metallization 3 is suitably produced on the lower surface of the substrate 201 at the same time. During this bonding operation, the assembly shown in FIG. 15 is disposed upside down in an oven, with the frame 210 located at the bottom.

Figure 16:
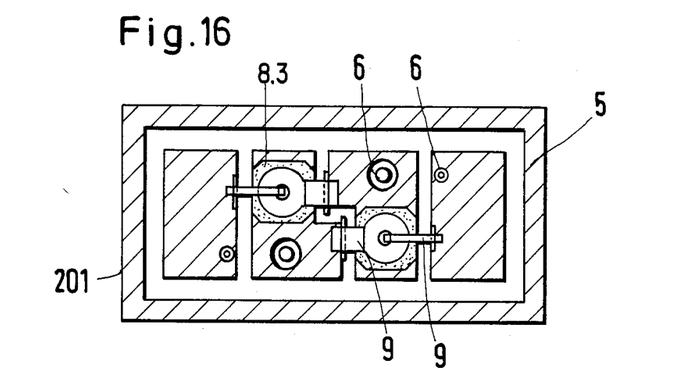
FIG. 16 is a plan view of the assembled substrate for the module of FIG. 17.

Once the frame 210 has been bonded to the substrate 201, assembly elements, namely semiconductor components 8.3, connecting elements 9 and connecting elements 6, are inserted and soldered. In the process, the intermediate bottom 200 along with its recesses 202 is used as a so-called lost soldering mold or form. The assembled substrate 201 is shown in FIG. 16 in a plan view, without the frame 210 above it. In the illustrated embodiment, connecting tabs with lateral wings or fins, according to German Published, Non-Prosecuted Application DE-OS No. 31 27 458, have been used as the connecting elements 9.

Figure 17:
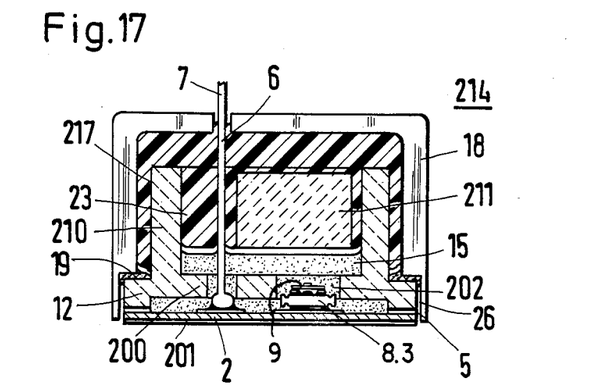
FIG. 17 is a cross-sectional view of the finished module having the frame according to FIGS. 12 and 15.

FIG. 17 shows a completed second module 214, which contains the third intermediate product 217 shown in FIG. 15. In order to produce this module 214, the soft sealing compound 15 is first poured in after the above-described assembly and soldering to the elements 6, 8.3, 9. Once this compound has undergone cross-linking, a ceramic insert 211 is inserted into the frame 210 as a substitute for the missing ribbing. Next, the intermediate product 217 equipped in this manner is inserted into a plastic housing 18 and bonded with the aid of sealing compound 19. Finally, the module 214 is filled with resin sealing compound 23.

Figure 18:
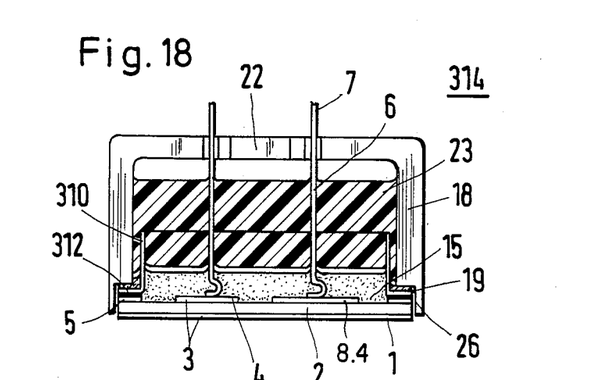
FIG. 18 is a cross-sectional view of a module having a metal frame for sealing against moisture.

A final embodiment 6 is shown in FIG. 18. FIG. 18 shows a third module 314 which differs from the embodiments described above in that a metal frame 310 is used instead of a ceramic frame. The frame 310 may, for example, be in the form of a stamped or deep-drawn part formed of thin sheet copper or sheet nickel-iron. The frame 310 shown is approximately 10 mm high and the lower edge is bent outward to form a base 312 approximately 4 mm wide. The frame 310 does not have any ribbing. The frame 310 can be joined to the substrate 1 by soldering or direct bonding. If sheet nickel-iron is used, then the known problem of differing expansion on the part of the frame 310 and the substrate 1 is avoided, because the coefficients of expansion of sheet nickel-iron and ceramic are similar. In order to improve adhesion between the metal frame 310 and the resin sealing compound 23, the surface of the sheet can be roughened, such as by sand blasting.

It is important that the sheet thickness for the frame 310 be thin enough, for example 0.3 mm thick, so that excessively high mechanical strains can not be exerted upon the substrate 1 and so that the sealing compound 23 can pull slightly inwardly when the sheet shrinks, without excessively bending the substrate 1. The spacings between the frame 310 and the conductor paths or runs 4 and the assembly elements 6, 8.4, 9 must also be great enough to produce the required insulation strength. Since the frame 310 is surrounded by sealing compound, the required leakage and air gaps can be attained without difficulty. The remaining structure of the module 314 corresponds to that of the first embodiment.

Naturally, other embodiments are possible, depending on the requirements made of the module and the invention is once again used advantageously in these embodiments. For example, instead of a plastic housing 18, a simple plastic or metal bracket may be used to secure the above-described intermediate product 17, 117, 217 and the ceramic frame 10, 110, 210 to a heat sink. In this case, only the interior of the ceramic frame 10, 110, 210 is filled with resin sealing compound 23 to a level just below the upper edge.

The foregoing is a description corresponding in substance to German Application No. P 36 04 882.8, dated Feb. 15, 1986, the International priority of which is being claimed for the instant application, and which is hereby made part of this application. Any material discrepancies between the foregoing specification and the aforementioned corresponding German application are to be resolved in favor of the latter.

We claim:

1. Power semiconductor module, comprising a plastic housing having an interior; a substrate in the form of a ceramic plate with upper and lower surfaces inserted in said housing as a housing bottom; metallizations disposed on said upper and lower surfaces of said ceramic plate, said metallization on said upper surface of said ceramic plate facing said interior of said housing and being structured to form conductor paths; power semiconductor components, connecting elements and terminal elements for external terminals all being disposed on said upper surface of said ceramic plate; a frame connected to said substrate in said interior of said housing, said frame having inner and outer surfaces; and sealing compound surrounding said inner and outer surfaces of said frame and cooperating with said frame for sealing againt moisture.

2. Power semiconductor module according to claim 1, wherein said metallizations on said ceramic plate are at least 0.1 mm thick.

3. Power semiconductor module according to claim 1, wherein said metallizations on said ceramic plate are 0.3 mm thick.

4. Power semiconductor module according to claim 1, wherein said frame is formed of ceramic material having substantially the same thermal expansion properties as said substrate.

5. Power semiconductor module according to claim 1, wherein said frame is formed of metal.

6. Power semiconductor module according to claim 5, wherein said frame is formed of ductile sheet copper.

7. Power semiconductor module according to claim 5, wherein said frame is formed of sheet nickel-iron.

8. Power semiconductor module according to claim 1, wherein said frame has a ribbing formed thereon.

9. Power semiconductor module according to claim 1, wherein said metallization on said upper surface of said ceramic plate has a metal rim formed thereon in addition to said conductor paths.

10. Power semiconductor module according to claim 1, wherein said frame has an intermediate bottom forming a soldering mold.

* * * * *